(12) United States Patent
Phelps et al.

(10) Patent No.: US 9,819,317 B2
(45) Date of Patent: Nov. 14, 2017

(54) MODULAR RF MATRIX SWITCH

(71) Applicant: Quintech Electronics & Communications, Inc., Indiana, PA (US)

(72) Inventors: Thomas B. Phelps, Cowansville, PA (US); Nicholas J. Johnston, Allison Park, PA (US)

(73) Assignee: Quintech Electronics & Communications, Inc., Indiana, PA (US)

( * ) Notice: Subject to any disclaimer, the term of this patent is extended or adjusted under 35 U.S.C. 154(b) by 0 days.

(21) Appl. No.: 14/831,369

(22) Filed: Aug. 20, 2015

(65) Prior Publication Data

US 2016/0065136 A1 Mar. 3, 2016

Related U.S. Application Data

(60) Provisional application No. 62/044,522, filed on Sep. 2, 2014.

(51) Int. Cl.
| | |
|---|---|
| H05K 7/14 | (2006.01) |
| H03F 3/21 | (2006.01) |
| H03F 3/19 | (2006.01) |
| H03F 1/02 | (2006.01) |
| H03F 3/72 | (2006.01) |
| H05K 1/14 | (2006.01) |
| H01P 1/10 | (2006.01) |

(52) U.S. Cl.
CPC ............ *H03F 3/211* (2013.01); *H03F 1/0277* (2013.01); *H03F 3/19* (2013.01); *H03F 3/72* (2013.01); *H03F 2200/451* (2013.01); *H03F 2203/21139* (2013.01); *H03F 2203/7233* (2013.01)

(58) Field of Classification Search
CPC ................................ H01P 1/10; H05K 5/0256
USPC .......................................... 333/101, 103, 104
See application file for complete search history.

(56) References Cited

U.S. PATENT DOCUMENTS

| 5,481,073 A | 1/1996 | Singer et al. | |
|---|---|---|---|
| 6,208,219 B1 * | 3/2001 | Singer | H01P 5/12 333/104 |
| 6,353,490 B1 * | 3/2002 | Singer | H04B 10/271 348/E7.07 |
| 6,816,486 B1 * | 11/2004 | Rogers | H05K 7/1445 340/2.21 |
| 6,844,793 B2 * | 1/2005 | Kenington | H03F 1/0288 333/101 |
| 7,088,173 B1 * | 8/2006 | Rozario | H03F 1/02 330/124 R |

(Continued)

*Primary Examiner* — Dean Takaoka
(74) *Attorney, Agent, or Firm* — Buchanan Ingersoll & Rooney PC

(57) ABSTRACT

An RF matrix switch has a first set of card slots at selected locations on the chassis and a second set of card slots at different selected locations on the chassis as well as input cards and output cards. The input cards, the output cards, the first set of card slots and the second set of card slots are all configured so that the input cards and the output cards fit into all of these slots. Reroute cards can be provided for any unused card slots. The RF matrix switch also may have an active power management system in which there is a power control switch connected to each amplifier that turns the amplifier off when the amplifier is not being used.

19 Claims, 6 Drawing Sheets

(56) References Cited

U.S. PATENT DOCUMENTS

| | | | | |
|---|---|---|---|---|
| 8,174,337 | B2* | 5/2012 | Chen | H04B 7/18515 333/101 |
| 8,369,321 | B2* | 2/2013 | Aybay | H04L 49/00 370/254 |
| 8,463,204 | B2* | 6/2013 | Jones | H03F 1/32 455/101 |
| 2004/0222849 | A1* | 11/2004 | Doi | H03F 3/68 330/124 R |
| 2005/0245209 | A1* | 11/2005 | Schlesinger | H01H 1/0015 455/102 |
| 2006/0013207 | A1* | 1/2006 | McMillen | G01J 3/06 370/388 |
| 2007/0016715 | A1* | 1/2007 | Phelps | H04Q 1/04 710/316 |
| 2008/0192727 | A1 | 8/2008 | Pesusich et al. | |
| 2009/0175281 | A1* | 7/2009 | Higuchi | H04L 49/1523 370/401 |
| 2013/0021104 | A1* | 1/2013 | Schmidt | H03F 1/0277 330/295 |
| 2013/0271236 | A1 | 10/2013 | Baldor | |
| 2014/0171010 | A1* | 6/2014 | Olson | H01L 27/088 455/338 |

* cited by examiner

MODULAR RF MATRIX SWITCH

CROSS-REFERENCE TO RELATED APPLICATION

The present application claims priority to U.S. Provisional Application Ser. No. 62/044,522 which was filed on Sep. 2, 2014. The entirety of the Provisional Application is incorporated by reference herein.

FIELD OF INVENTION

The present invention relates to RF matrix switches which are commonly used in the telecommunications industry to connect RF signal sources to their destination.

BACKGROUND OF THE INVENTION

RF matrix switches are commonly used in telecommunications, typically in satellite downlink and uplink applications. They are used as physical layer switches to connect RF signal sources to their destinations. The incorporation of RF splitter or combiner circuits allows one signal source to be routed to multiple destinations or multiple signal sources to be routed to a single destination. Being able to make these connections on demand provides a great deal of flexibility in RF signal management and routing systems.

One trend over the past few years has been the need for large RF matrix switches with more than 64 inputs or outputs. However, large RF matrix switches have multiple issues. A single "one size fits all" system size which might be cost effective for a fully populated matrix may not be cost effective for an application with fewer than the maximum inputs and outputs. Expanding beyond the size of a single matrix module requires the use of many external expansion modules in addition to the multiple matrix modules. This quickly increases system cost and size. Large RF matrix switches have high power consumption, along with heat generation and noise pollution from the high-speed fans required to cool the unit.

Three-stage Clos network architectures are typically used to implement large RF matrices because they are more efficient and less costly than a full crossbar type architecture. The larger the matrix is, the larger the advantage of using a three-stage matrix architecture. However, the Clos architecture is relatively inefficient and more expensive for less than fully populated configurations. This is because regardless of the number of inputs or outputs, all of the middle stage matrix cards must be populated. Because it is common in many applications to have more outputs than inputs, a standard three stage square or symmetrical matrix will be a costly solution for many of these cases.

To date all commercially available 3-stage RF switch matrix implementations have used square or symmetrical block sizes, with the maximum number of inputs and outputs in a single chassis being the same. For applications that have more outputs than inputs one can build an asymmetric Clos network rather than a symmetric network. However, because of the relatively low volume of RF matrix switches it is not cost effective to build different chassis configurations specifically for different application sizes.

There is a need for an RF matrix switch which does not have these problems. Such a switch should be modular and able to be easily configured and reconfigured to implement multiple different matrix block sizes in the same chassis without having to change the backplane or basic configuration of the chassis, including the ability to reassign input and output card slots. This switch should also have the ability to implement reduced matrix block sizes in the standard chassis.

RF matrix switches typically use amplifiers biased for Class A operation to provide the maximum linearity and fidelity in the RF signal path. Unfortunately Class A operation requires the most power of the amplifier bias classes. The amplifiers in any active RF matrix switch account for the vast majority of the power consumed and heat generated in the system. For a large matrix module such as a 128×128 module, the power needed for amplifiers, the heat produced, and the cooling required become significant design and operation issues.

In most large RF matrix switch designs there are multiple amplifiers for any signal path. In the 3-stage Clos network in particular there are multiple paths available for any input to output connection, raising the probability of unused RF paths. The current state of the art is that RF matrix switches have all amplifiers on all the time regardless of whether they are being used or not by the signals passing through the matrix switch. They remain on because turning off an amplifier that is not being used can adversely affect the RF signal traveling through other amplifiers and paths in the switch. Keeping all amplifiers on all of the time produces high power consumption, along with associated heat generation and noise pollution from the high-speed fans required to cool the unit.

There is a need for a method and RF matrix switch in which amplifiers are actively managed to reduce power consumption without compromising RF performance. Active management of the amplifiers could greatly reduce power consumption and also reduce generated heat and the need for cooling.

SUMMARY OF THE INVENTION

We provide a novel technique to implement multiple different matrix block sizes (maximum # of inputs and outputs) in a standardized common chassis without having to change the backplane, connections between cards, or the basic configuration of the chassis. On our RF matrix switch the backplane and/or card slots remain fixed and the matrix block size (maximum # of inputs and outputs) is determined by changing what cards are installed in what backplane or chassis card slot. The input cards and output cards are designed to fit the same slot in the chassis. The inputs/outputs of the cards are such that the outputs of the input card and the inputs of the output card are located in the same relative position in a slot. Likewise the inputs of the input card and the outputs of the output card are located in the same relative position in a slot.

In our switch the number of middle cards remains the same while the number of input cards and output cards changes according to the desired asymmetrical matrix size and the required number of inputs and outputs. The chassis card slots are reassigned by the control system according to the required number of input cards and output cards for a given block size. The total number of matrix card slots in the chassis remains fixed. The use of the card slots can be assigned and reassigned as needed to implement the desired matrix block size. This assignment can be done in any arbitrary way to re-use the existing backplane or card to card connections. The preferred arrangement when changing between slots types is to reassign cards slots starting with the highest available inputs or outputs. In this way both the inputs and the outputs remain grouped together in contiguous numerical blocks. The reassignment could be done in other ways, this is just the most logical and preferred arrangement.

We further provide for the use of manual or automatic ways to change the number and locations of the middle card inputs and outputs to support both the desired asymmetrical matrix size and the reassigned input and output card slots.

We also provide active power management in RF matrix switches which greatly decreases the power used by a RF matrix by turning off power to the amplifiers and/or other components in unused signal paths.

Other objects and advantages of our RF matrix switch will become apparent from certain present preferred embodiments thereof which are shown in the drawings.

DESCRIPTION OF THE PREFERRED EMBODIMENTS

Figure 1:
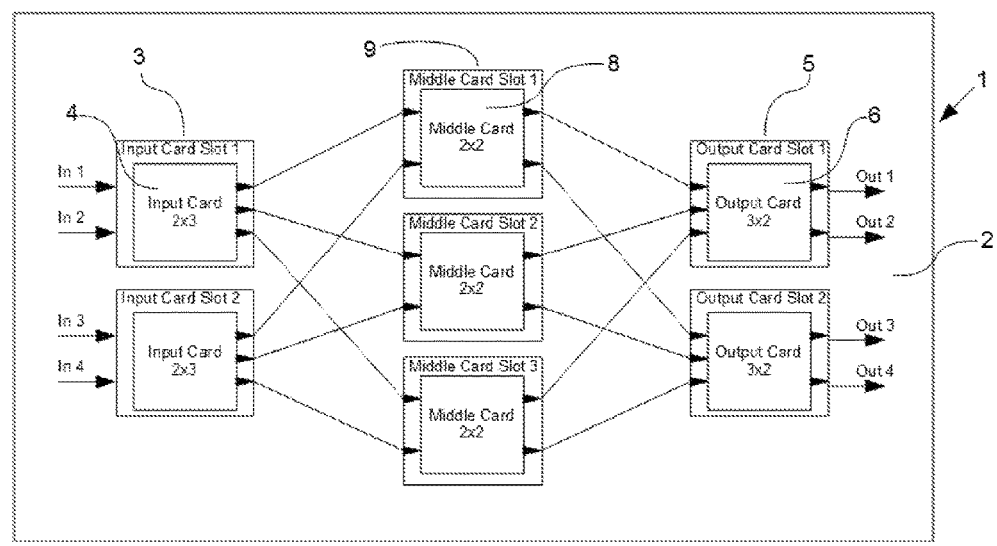
FIG. 1 is a diagram of a 4×4 3-stage Clos matrix switch known in the art.

In an RF matrix switch there is a chassis which has a first set of card slots for input cards having input ports and a second set of card slots for output cards having output ports. The number of available input ports is usually the same as the number of available output ports. An example of a conventional three-stage 4×4 RF matrix switch is shown in FIG. 1. That RF matrix switch 1 has a chassis 2 having a first set of card slots 3 identified as input card slots in the drawing, each slot containing an input card 4. There is a second set of card slots 5 identified as output card slots in the drawing, each slot containing an output card 6. The first set of card slots 3 is usually in a different location on the chassis than the second set of card slots 5, such as on opposite sides or on opposite ends of the chassis. In the conventional RF matrix switch the input cards, and input slots are configured differently from the output cards and the output card slots such that the input cards will not fit into the output card slots and the output cards will not fit into the input card slots. In this context "fit" means that the card can be both inserted into the slot and make contact such that signals can be transferred to or from the card and the matrix switch is operable. The input cards 4 and the output cards 6 are connected to middle cards 8 in middle card slots 9. Lines between the input cards and the middle cards and lines between the middle cards and the output cards indicate the paths of the signals through the matrix switch. In this example there are 2×3 input cards, 2×2 middle cards and 3×2 output cards. However, it should be understood that the matrix switch could contain other sizes or types of input cards, middle cards and output cards.

Figure 2:
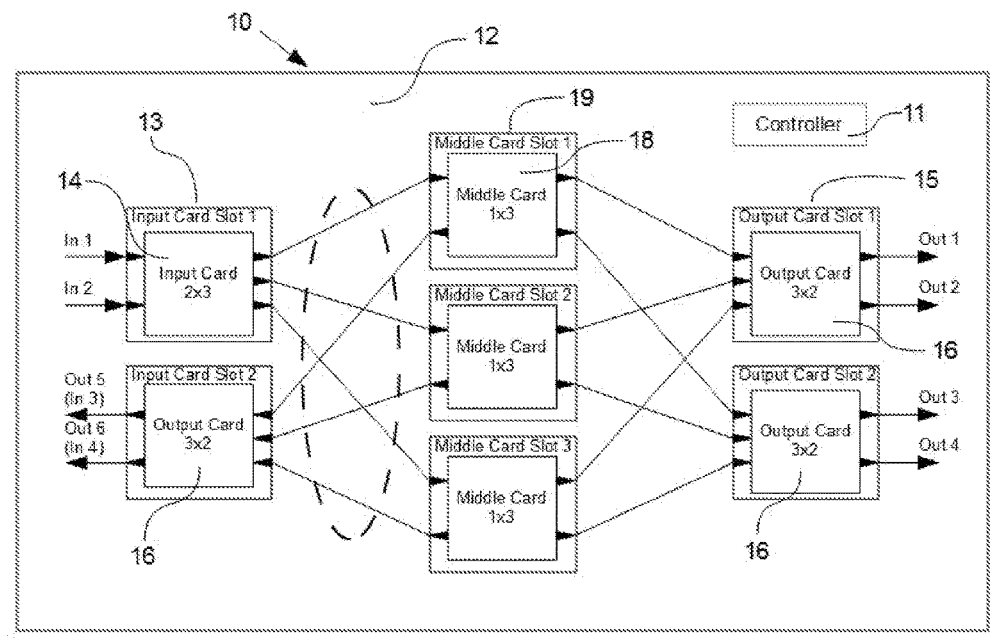
FIG. 2 is a diagram of a 2×6 matrix switch in accordance with the present invention on a chassis with the same number of card slots as the matrix switch shown in FIG. 1.

Referring to FIG. 2 a first present preferred embodiment of our RF matrix switch 10 has a chassis 12 with the same number of card slots as the chassis in the RF matrix switch in FIG. 1. There is a first set of card slots 13 identified as input card slots in the drawing, and a second set of card slots 15, identified as output card slots in the drawing. In this embodiment the first set of card slots 13 and the second set of card slots 15 have the same configuration such that any card that fits into a slot in the first set of card slots will fit into the slots in the second set of card slots and vice versa. In this RF matrix switch 10 there is one input card 14 and three output cards 16. There are three middle cards 18, each in a middle card slot 19. However the middle cards are configured to be 1×3 cards each receiving an input from the input card 14 and each sending an output to each of the output cards 16. There are the same number of paths between the cards in the first set of card slots and the middle cards in the matrix switch in FIG. 2 and in the conventional matrix switch in FIG. 1. However, in our RF matrix switch 10 one path between each middle card and each card in the first set of slots 13 has changed direction. The arrows on the sides of the cards indicate signal direction.

The middle cards 18 may be of fixed configuration (fixed number of inputs and outputs) or have the ability to be reconfigured to change the number of inputs and outputs on the card. This could be done manually or by software. We may provide a controller 11 that is connected to the middle cards and that provides instructions to the middle cards as to how they should be configured. Only the RF signal paths, and not the paths for control signals, are shown in FIG. 2.

In our RF matrix switch the backplane and/or card slots remain fixed and the matrix block size (maximum # of inputs and outputs) is determined by changing what cards are installed in what backplane or chassis card slot. The input cards and the output cards are designed to fit the same slot in the chassis. The Inputs/Outputs of the cards are such that the outputs of the input card and the inputs of the output card are located in the same relative position in a slot. Likewise the inputs of the input card and the outputs of the output card are located in the same relative position in a slot.

While the number of middle cards remains the same, and they use the same slots in the chassis, the remaining card slots are assigned as input card slots or output card slots by the controller or a control system according to the desired asymmetrical matrix size and the required number of inputs and outputs. This is subject to the limitation that the total number of input card slots and output card slots remains fixed. The card slots are reassigned in such a way that the highest available inputs or outputs are reassigned when changing between slot types. In this way both the inputs and the outputs remain grouped together in contiguous numerical blocks. The reassignment could be done in other ways, this is just the most logical and preferred arrangement.

There are cards that can be configured either as an input card or as an output card. Hence, it may not be necessary to physically replace a card to change the configuration. Consequently there can be manual ways and/or automatic ways to change the number and locations of the inputs and outputs to support both the desired asymmetrical matrix size and the reassigned card slots.

In the minimum case, a different middle card built for a specific size is used when implementing an asymmetric matrix. In the typical case and most cost effective method, a single middle card is used which can be manually reconfigured to support multiple matrix configurations. In the ideal but most costly method, a single middle card contains extra circuitry that causes it to be automatically reconfigured on receipt of a command or control signal.

Figure 3:
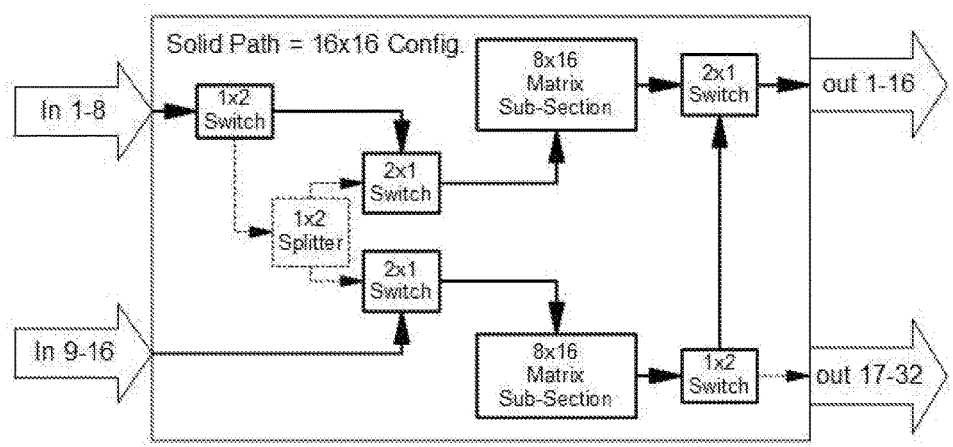
FIG. 3 is a diagram of a preferred embodiment of a middle card in a 16×16 configuration with circuitry to support automatic reconfiguration.
Figure 4:
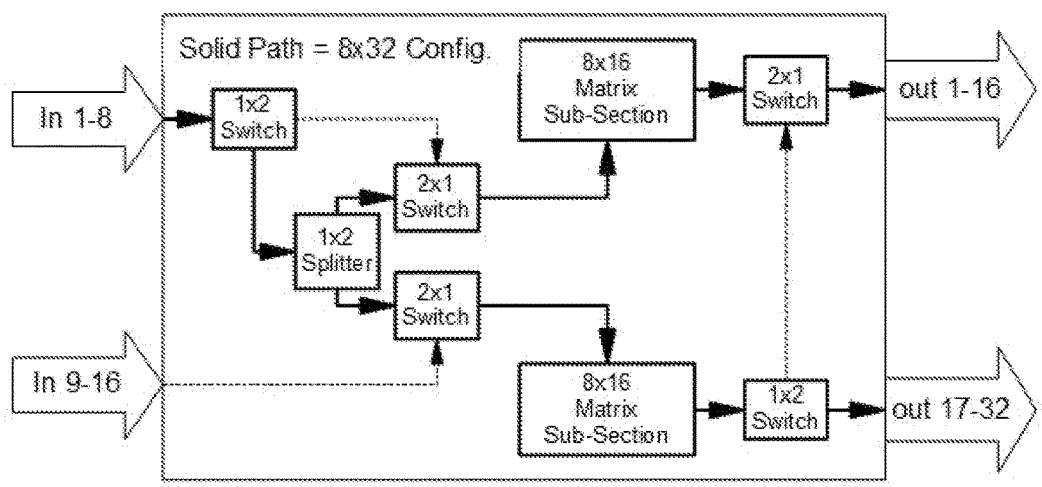
FIG. 4 is a diagram of the middle card shown in FIG. 3 which has been reconfigured to an 8×32 configuration.

Reconfiguration is illustrated by the simplified diagrams in FIGS. 3 and 4 showing an example auto-configure middle card which is configured in a 16×16 mode in FIG. 3 and is configured in a 8×32 mode in FIG. 4. The signal paths being used are in solid line and the unused paths are in dotted line in these figures. With 8×16 Input cards and 16×8 Output cards the 16×16 mode supports a 128×128 matrix. In 8×32 mode the matrix switch is limited to configurations with 32 total I/O, from 1×31 to 8×24. These middle card configurations support matrix sizes from 8×248 to 64×192. These diagrams do not show the additional 1×2 switches that would be required to route the additional outputs to the ports no longer needed for input signals. For example, new outputs 17-24 would use the ports originally used for In 9-16, while new outputs 25-31 would use the ports originally used for In 2-8.

Because of the high degree of complexity and therefore the cost for an auto-configuring middle card, most systems will never be reconfigured to a different block size after they are put in service. In light of this, a single card that can be manually configured for multiple different sizes at the time of manufacture provides a better value for the customer. In this case connections between the various sections and the I/O at the card edge are established using cables and/or optionally placed parts instead of switches. To change configurations means disconnecting cables from one location and reconnecting them to another, and/or putting on or removing parts or sub-assemblies.

A variation on this manual configuration is to group all the connection points on the chassis or PCB such that a secondary "personality" assembly can be plugged on the PCB to make the desired connections. Changing from one configuration to another is then reduced to changing personality modules. However using manually reconfigured cable connections and/or parts is still a lower cost implementation.

Another variation on this manual configuration is to arrange for card connections to alternate along a card edge, for example input, output, input, output, etc. By fixing the connectors to a mounting piece and using flexible cables, shifting the positions of the connectors connects inputs to what were outputs and outputs to what were inputs in the switch according to where the particular card is being connected.

Figure 5:
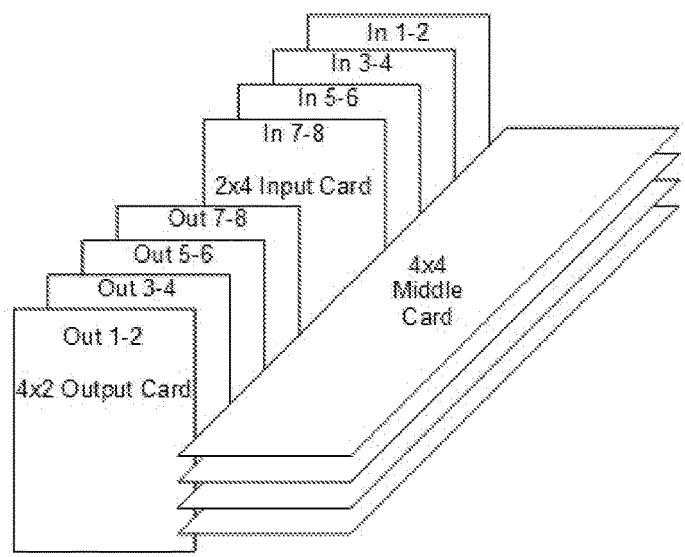
FIG. 5 is a diagram of the cards in an RF matrix switch having four input cards and four output cards connected to four middle cards configured to provide a 4×4 matrix.
Figure 6:
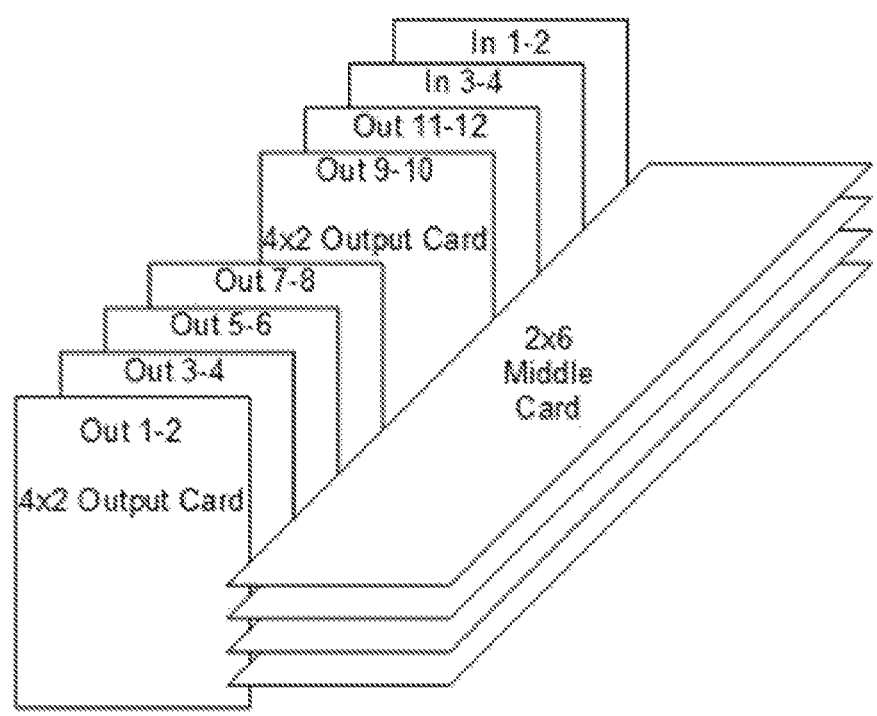
FIG. 6 is a diagram similar to FIG. 5 in which the RF matrix switch has two input cards and six output cards connected to four middle cards configured to provide a 2×6 matrix.

A stylized example of a 3-stage RF matrix configuration applying the middle card modification and I/O slot reassignment feature is shown in FIGS. 5 and 6. In this diagram there is a single RF connection at each point where the card edges meet. FIG. 5 shows a standard configuration having four input cards and four output cards. All of the input cards are together and all of the output cards are together. In the configuration shown in FIG. 6 all the card slots and the total number of cards have stayed the same. However, the middle cards have been automatically or manually reconfigured to be 2×6 instead of 4×4 by rearranging the internal connections between matrix sub-sections and reassigning to inputs to be outputs instead. In association with that change, two input card slots have been reassigned to be output slots and populated with output cards.

For maximum manufacturing efficiency, it can be chosen to manufacture only a single card and use it for input, output, and middle cards. By extending the control switch mechanisms previously described, a middle card is created where the position of the input and output connectors can be reassigned such that it can be used in an input card location or in an output card position as well as in a middle card location.

The various assemblies can be built from both digital and RF ICs and amplifiers. Digital control can be done using Microchip 18F series microcontrollers and Altera Max V CPLDs, along with the firmware to implement the desired control functions. The Peregrine PE4246 SPDT and PE5783 SPST, and Skyworks SKY13330 SPDT RF switches can be used in the RF path along with Peregrine PE4203 digital step attenuators for gain control. Avago MGA30689 and MGA 30889, and RF Micro Devices SBB5089z RF amplifiers can be used. There are a large number of similar components commercially available that may also be used.

We also prefer to provide a technique to implement a reduced matrix block size in the standard chassis, thereby reducing the number of middle cards required compared to a partially populated larger matrix, by installing signal reroute cards in unused input, output, and middle card slots. This technique is illustrated by the RF matrix switch 20 shown in FIG. 7.

Figure 7:
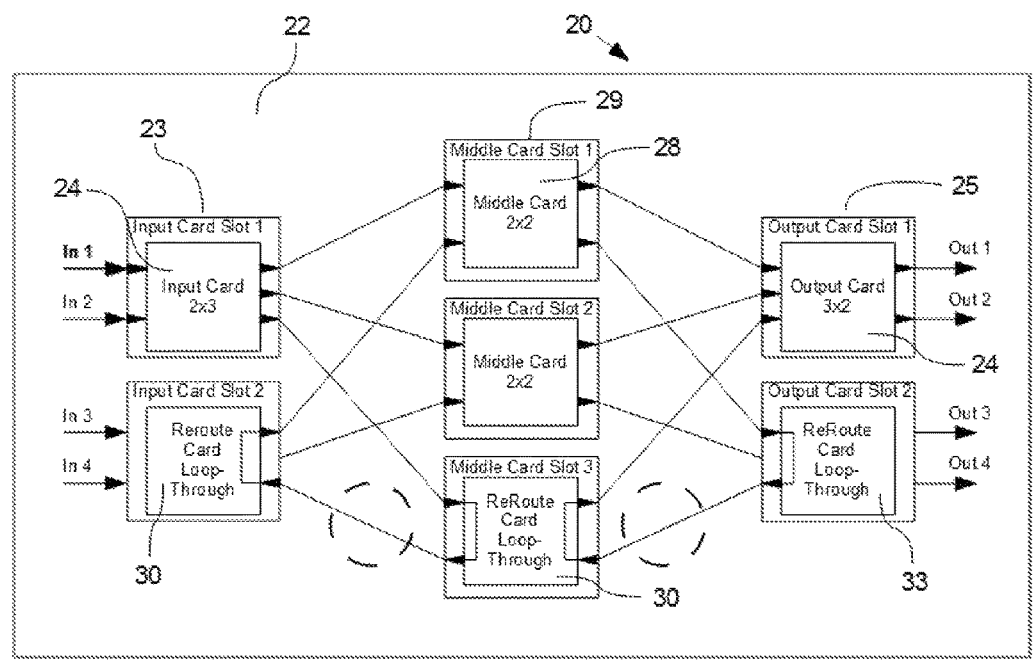
FIG. 7 is a diagram of another present preferred embodiment of our RF matrix switch which contains reroute cards.

The RF matrix switch 20 shown in FIG. 7 has a chassis 22 with the same number of card slots as the RF matrix switches in FIGS. 1 and 2. There is a first set of card slots 23, identified as input card slots in the drawing, and a second set of card slots 25, identified as output card slots in the drawing. There are also three middle card slots 29. One of the card slots in the first set of card slots contains in input card 24. The other card slot in the first set of card slots contains a reroute card 30. One of the card slots in the second set of card slots 25 contains in output card 24. The other card slot in the second set of card slots contains another reroute card 30. Two of the three middle card slots 29 contain middle cards 28 and the third middle card slot contains yet another reroute card 30. There are the same number of paths between the cards in the first set of card slots and the cards in the middle card slots in the matrix switch in FIG. 7 and in the matrix switches in FIGS. 1 and 2. There are also the same number of paths between the cards in the middle card slots and the cards in the second set of card slots and in the matrix switch in FIG. 7 and in the matrix switches in FIGS. 1 and 2. However, in the RF matrix switch 20 the signal travels in an opposite direction along the paths within the circles shown in broken line.

Reroute cards 30 are installed in unused input, output, and middle card slots. The reroute cards in unpopulated middle card slots route signals from the populated input cards first to an unpopulated input card slot. A second reroute card in that slot routes signals to unused input ports on the populated middle cards. Likewise a similar operation happens on the output card side. The cost of the reroute cards is much less than the cost of the middle cards that would otherwise have to be populated. The reroute or "loop through" cards contain no circuitry, just traces or a cable on the PCB.

The use of reroute cards allows a smaller matrix to be installed in a chassis made for a larger matrix at a reduced cost compared with a partially populated larger matrix, because only some of the middle cards must be populated. For example, a 64×64 matrix can be built in a 128×128 chassis using only eight 16×16 middle cards instead of sixteen. This is a significant cost savings. This fits into the classic 3-stage network by considering that each 8×16 input card then emulates two 4×8 cards, each 16×16 middle card emulates two 8×8 cards, and each 16×8 output card two 8×4 output cards. For expansion beyond the smaller matrix, all that is necessary is to swap out the reroute cards for actual RF matrix cards.

A typical RF amplifier circuit consists of an RF input, a DC blocking capacitor, the RF amplifier, a DC bias or power feed network, a DC blocking capacitor and the RF output. The bias network consists of a power source which is fed through a bias inductor along with other resistors and capacitors as needed. The purpose of the inductor is to allow DC power through to the amplifier while blocking any RF signal from propagating into the power circuit.

In an RF device such as a matrix switch the RF amplifiers use the most power. Also, there are multiple RF paths and not all paths are being used at the same time. Turning off the RF amplifiers for paths that are not currently in use will reduce power consumption of the overall device. The power saving can be significant depending on how many amplifiers can be turned off at any given time. Therefore, we prefer to provide active power management in RF matrix switches which greatly decreases the power used by a RF matrix by turning off power to the amplifiers and/or other components in unused signal paths. Active management of the amplifier power can greatly reduce power by as much as 50% or more, in turn reducing generated heat and the need for cooling. For that reason we prefer to utilize the RF amplifier circuit shown in FIG. 8.

Figure 8:
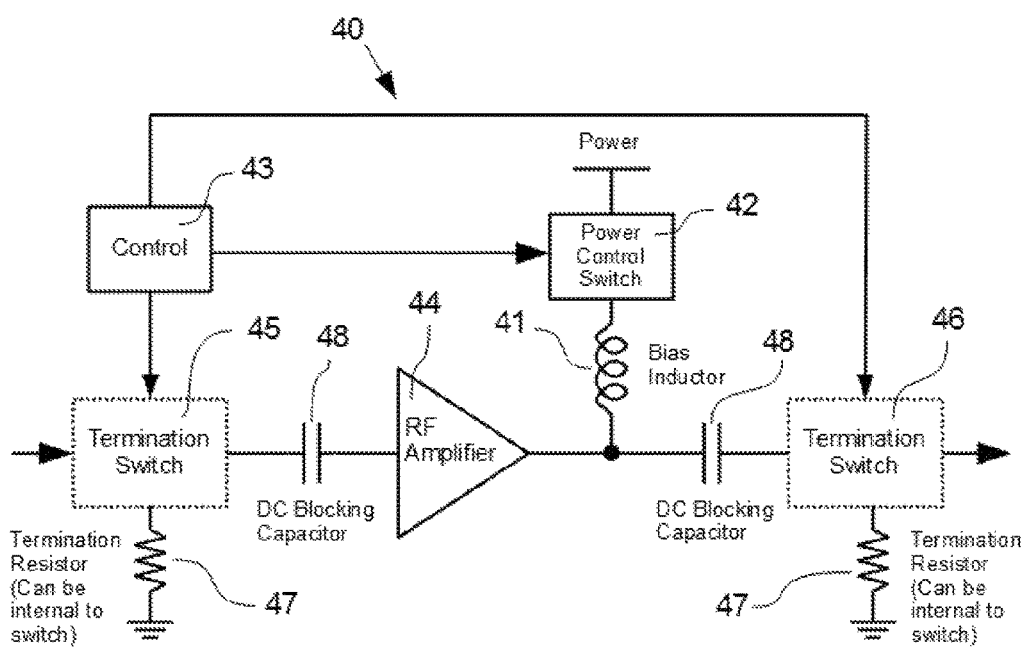
FIG. 8 is a diagram of a present preferred amplifier circuit of our RF matrix switch.

In the RF amplifier circuit 40 in FIG. 8 we provide a power control switch 42 in order to turn power off to the amplifier 44. This switch is added to the DC bias circuit and when instructed by a control unit or a control system 43 will turn off the power flow through the bias network. The power control switch 42 can be placed anywhere on the power feed to the particular amplifier. In FIG. 8 the power control switch is shown in the preferred location prior to the bias inductor 41, since that reduces the possibility of RF leaking through the power control switch control lines and thus decreasing the RF isolation between channels. In addition, we prefer to provide up to two termination switches 45, 46 which are added to the amplifier circuit, one at the input and one at the output, depending on the circuit where the amplifier is used. A DC blocking capacitor is provided between each termination switch 45, 46 and the amplifier 44. The termination switches 45, 46 are also controlled by the control system 43 such that when the power to the RF amplifier 44 is turned off, the termination switches 45, 46 are turned on in order to terminate the RF line to the desired impedance. The control system 43 monitors the current state of the device and determines which paths and associated amplifiers are not being used. It then turns off the unused RF amplifiers and terminates the RF line at the input or output of the RF amplifier as required. In most RF matrix switches there will be several amplifiers, preferably each amplifier being in a circuit like that shown in FIG. 8. The use of a power control switch connected to each amplifier allows some amplifiers to be turned off while other amplifiers have power and are operating.

Removing power from the amplifier typically produces an impedance mismatch at the input and/or output of the amplifier. This impedance mismatch can produce undesirable affects in the circuits connected to the amplifier. The termination switches are used to isolate this impedance mismatch from circuits before or after the amplifier to prevent any undesirable degradation in the RF performance. A termination switch is only required if the preceding or following circuit will be affected by the impedance mismatch when the amplifier is off. For example, if the circuit preceding the RF amplifier is a Wilkinson splitter, the splitter will be adversely affected by an impedance mismatch at the amplifier, so a termination switch is needed in between the splitter and the amplifier. If the termination switch is not needed then the circuit can be simplified by deleting the switch. The termination switch can use either an internal termination resistor, if so equipped, or an external termination resistor 47. In the preferred case it will be a SPDT or SPST solid state RF switch but could also be any other RF switching element which can terminate the RF signal line to the desired impedance or a termination resistor.

We prefer to provide a control system consisting of a software program and a hardware control circuit with multiple control lines out. The control system keeps track of what paths and amplifiers are in use. Each control line is used to turn on or off the power control switch which in turns controls the power input to an RF amplifier through a bias network connected to the output of the RF amplifier. The control system also operates the termination switches that are provided in those cases where turning off an amplifier will cause an impedance mismatch that would affect circuits such as splitters connected to the input and/or output. We prefer that the same control line turns on and of the power control switch for the amplifier as well as any termination switches that are connected to that amplifier.

We prefer to use Microchip 18F series microcontrollers and Altera Max V CPLDs to generate the control signals for active power management. At each power control point we prefer to provide a Micrel 94040 high-side FET switch to gate the power.

Although we have shown and described certain present preferred embodiments of our RF matrix switch our invention is not so limited and may be variously embodied within the scope of the following claims.

We claim:

1. An improved RF matrix switch of the type having a chassis which contains input cards, a first set of card slots at selected locations on the chassis, output cards and a second set of card slots at different selected locations on the chassis wherein the improvement comprises the input cards, the first set of card slots, the output cards and the second set of card slots are all configured so that the input cards fit into both the first set of card slots and the second set of card slots and the output cards fit into both the first set of card slots and the second set of card slots.

2. The improved RF matrix switch of claim 1 wherein the RF matrix switch contains more output cards than input cards or more input cards than output cards.

3. The improved RF matrix switch of claim 1 also comprising a first set of switches connected to the first set of slots and a control unit connected to the first set of switches in a manner so that the control unit can change path of a signal through at least one of the switches in the first set of switches.

4. The improved RF matrix switch of claim 1 also comprising a second set of switches connected to the second set of slots and a control unit connected to the second set of switches in a manner so that the control unit can change path of a signal through at least one of the switches in the second set of switches.

5. The improved RF matrix switch of claim 1 also comprising a set of middle card slots on the chassis each middle card slot having a middle card, the set of middle card slots being connect to the first set of slots and being connected to the second set of slots.

6. The improved RF matrix switch of claim 5 also comprising a control unit connected to the second set of switches in a manner so that the control unit can change flow of a signal through at least one of the middle cards and thereby change the path of a signal from the first set of card slots to the second set of card slots.

7. The improved RF matrix switch of claim 1 also comprising at least one reroute card in at least one of the first set of card slots and the second set of card slots.

8. The improved RF matrix switch of claim 7 wherein the at least one reroute card being in one of the first set of slots or in one of the second set of slots, being connected to at least one middle card and configured to route a signal from one middle card to another middle card.

9. The improved RF matrix switch of claim 1 wherein the RF matrix switch contains at least one amplifier having an input and an output and further comprising a power control switch connected directly to the amplifier for turning off power to the amplifier.

10. The improved RF matrix switch of claim 9 also comprising a control unit connected to the power control switch.

11. The improved RF matrix switch of claim 9 also comprising a termination switch connected to the input of the amplifier or connected to the output of the amplifier.

12. The improved RF matrix switch of claim 11 also comprising a termination resistor connected to the termination switch.

13. The improved RF matrix switch of claim 1 wherein the RF matrix switch also comprises at least one middle card connected to at least one input card and connected to at least one output card and also comprises at least one of a chassis and a backplane, and wherein the RF matrix switch can be reconfigured by reconfiguring the at least one middle card automatically, manually or by replacing the middle card without changing the chassis and without changing the backplane.

14. The improved RF matrix switch of claim 1 wherein the input cards have inputs and outputs, the output cards have inputs and outputs, the outputs of a selected one of the input cards and the inputs of a selected one of the output cards are located in a same relative slot position in a slot and the inputs of the selected one of the input cards and the outputs of the selected one of the output cards are located in a same relative position in a slot.

15. An improved RF matrix switch of the type having a chassis which contains input cards, a first set of card slots at selected locations on the chassis, output cards and a second set of card slots at different selected locations on the chassis wherein the improvement comprises the input cards, the first set of card slots, the output cards and the second set of card slots are all configured so that the input cards fit into both the first set of card slots and the second set of card slots and the output cards fit into both the first set of card slots and the second set of card slots also comprising at least one amplifier having an input and an output and further comprising a power control switch connected directly to the amplifier for turning off power to the amplifier, a first termination switch connected to the input of the amplifier and a second termination switch connected to the output of the amplifier.

16. The improved RF matrix switch of claim 15 wherein the RF matrix switch contains a plurality of amplifiers, each amplifier having an input and an output, and further comprising a plurality of power control switches, each power control switch connected a respective one of the plurality of amplifiers for turning off power to that amplifier.

17. The improved RF matrix switch of claim 16 also comprising a control unit connected to the power control switches.

18. The improved RF matrix switch of claim 15 also comprising a termination resistor connected to one of the first termination switch and the second termination switch.

19. An improved RF matrix switch of the type having a chassis which contains input cards, a first set of card slots at selected locations on the chassis, output cards, a second set of card slots at different selected locations on the chassis, middle cards and middle card slots in which signals are transmitted from the input cards to the middle cards and from the middle cards to the output cards wherein the improvement comprises at least one reroute card, each reroute card being in one of the first set of card slots or one of the second set of card slots the at least one reroute card being connected to at least one middle card and configured to route a signal from one middle card to another middle card.

* * * * *